(12) United States Patent
Rajeswaran

(10) Patent No.: US 9,159,955 B1
(45) Date of Patent: Oct. 13, 2015

(54) METHOD AND APPARATUS FOR PATTERNING AN ORGANIC DEVICE

(71) Applicant: GRANTWOOD LIMITED, Hong Kong (HK)

(72) Inventor: Gopalan Rajeswaran, Fairport, NY (US)

(73) Assignee: GRANTWOOD LIMITED, Hong Kong (HK)

( * ) Notice: Subject to any disclaimer, the term of this patent is extended or adjusted under 35 U.S.C. 154(b) by 0 days.

(21) Appl. No.: 14/245,218

(22) Filed: Apr. 4, 2014

(51) Int. Cl.
| H01L 51/52 | (2006.01) |
| H01L 51/56 | (2006.01) |
| F21V 21/00 | (2006.01) |
| F21K 99/00 | (2010.01) |

(52) U.S. Cl.
CPC ............ *H01L 51/5271* (2013.01); *F21K 9/54* (2013.01); *F21V 21/00* (2013.01); *H01L 51/56* (2013.01)

(58) Field of Classification Search
CPC .......................... H01L 51/56; H01L 51/5271
See application file for complete search history.

(56) References Cited

U.S. PATENT DOCUMENTS

| 6,695,030 | B1 * | 2/2004 | Phillips et al. | 156/540 |
| 2012/0326136 | A1 * | 12/2012 | Chen | 257/40 |
| 2012/0326139 | A1 * | 12/2012 | Chen | 257/40 |
| 2014/0103328 | A1 * | 4/2014 | Pfeifer et al. | 257/40 |
| 2014/0167016 | A1 * | 6/2014 | Yoo et al. | 257/40 |

* cited by examiner

*Primary Examiner* — Mamadou Diallo

(57) ABSTRACT

A method for patterning an organic device includes providing a patterned product substrate and pre-defined patterned source substrate. The product substrate has a product principal surface having destination regions. The source substrate has a source principal surface having optically reflecting regions and absorbing regions arranged adjacent to each other. The source principal surface includes plurality of source regions defined at the reflecting regions. The plurality of source regions has organic materials disposed thereon. The product principal surface and the source principal surface are aligned such that each of the plurality of source regions is aligned to exactly one destination region. At least one of the product principal surface and the source principal surface includes support(s) to maintain a substantially uniform gap between them. Then temperature of the source substrate is raised above the sublimation temperature of the organic materials to redeposit at a nearest destination region.

23 Claims, 11 Drawing Sheets

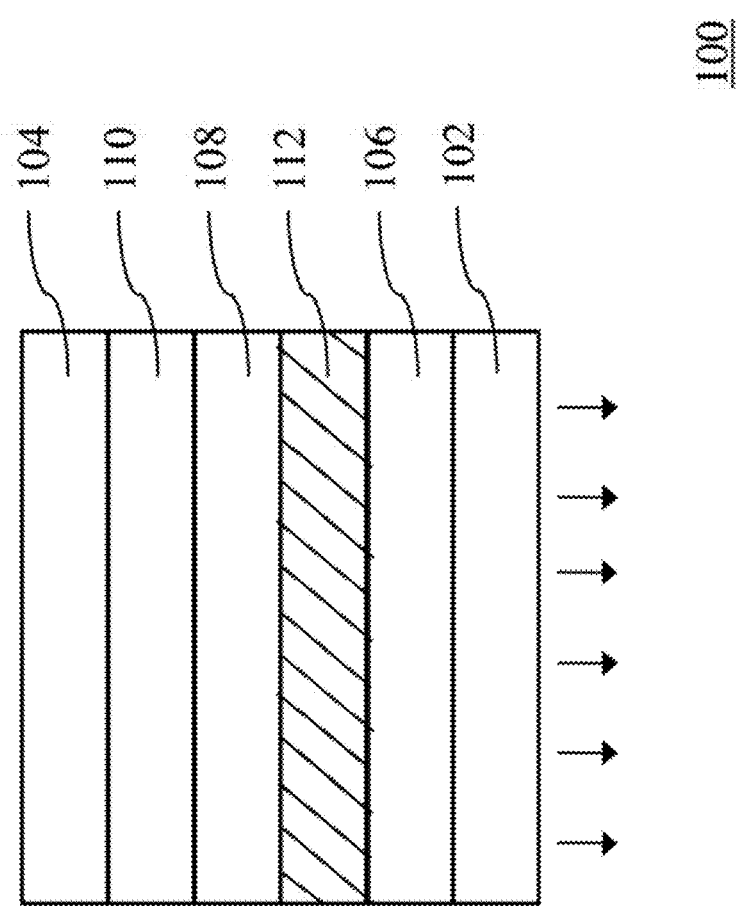

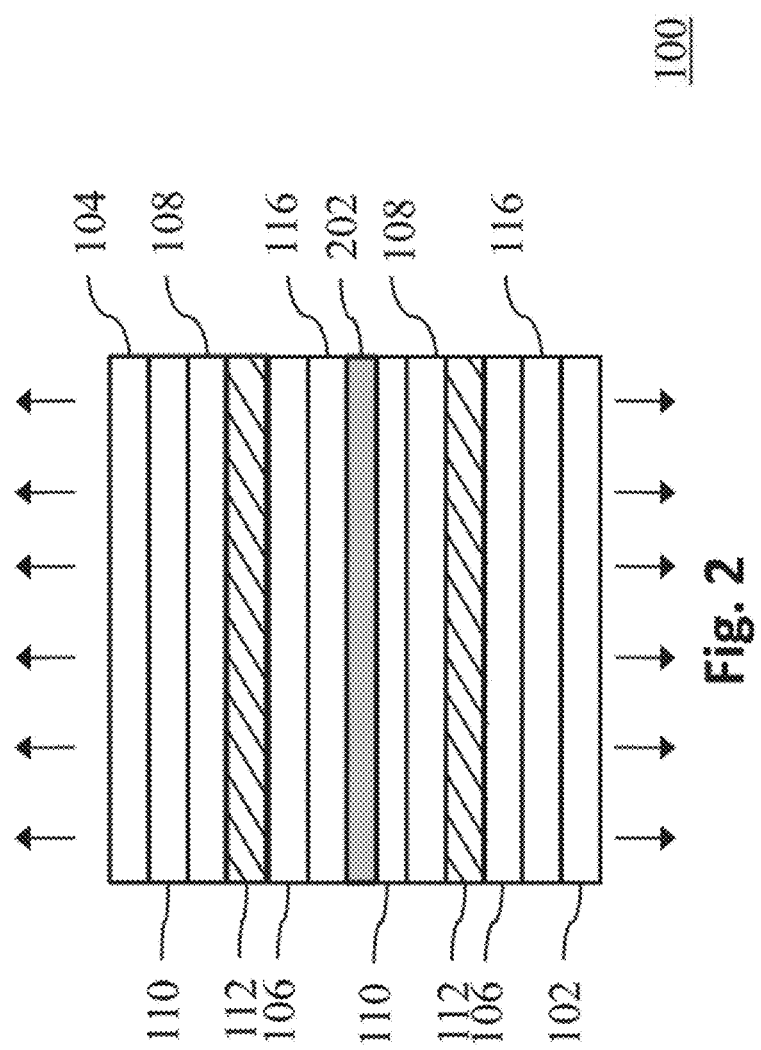

METHOD AND APPARATUS FOR PATTERNING AN ORGANIC DEVICE

BACKGROUND OF THE INVENTION

The present invention relates to a full color organic device and more particularly to a method and an apparatus of patterning a full color organic device for display and lighting applications.

The use of organic light emitting diode (OLED) displays is becoming increasingly common these days. The OLED displays can be used for various applications of various resolutions and sizes, including but not limited to, a mobile phone display, a tablet display, a laptop display and a television display.

The most common embodiment of full color OLED displays consists of a periodic arrangement of red, green, blue (RGB) or red, green, blue and white (RGBW) color emitting pixels. The number of such color emitting pixels in a display, the size of each of the individual pixels and the spacing between the pixels determine the OLED display characteristics for the intended application. The most common method of preparing commercial OLED displays is by vacuum sublimation of organic molecules from an organic source on to a partially finished display substrate. The organic materials forming the emission layer are formed at each of the target pixel locations on the display substrate, for either of the RGB or RGBW configurations by an appropriate patterning strategy. The emission layer is one of the constituting layers of the OLED device structure of each type of color pixel. There are two vacuum compatible patterning methods commonly employed in commercial OLED display manufacturing. In the case of RGB OLED displays, a physical shadow mask, commonly known as the fine metal mask (FMM), is employed for color pixel patterning. The FMM contains apertures matching the intended color pixel patterns of the OLED displays. The FMM, which is located in the path of the subliming emission layer materials, is at first aligned in close proximity with the display substrate in a vacuum environment before exposure to the path of the subliming organic materials. The FMM apertures are designed to match the pixel patterns covering the entire display substrate area so that all the color pixel layers can be deposited simultaneously. This FMM patterning method is repeated for each of the RGB colors on each of the display substrate to result in the creation of patterns of RGB emission layers on the display substrate. The FMM method, while successful thus far in mobile displays applications, may not be able to meet the increasing demand of higher resolutions in either the smaller mobile displays or the larger television displays, due to complications of mask preparation, mask alignment and accuracy of color reproduction. In the case of RGBW OLED displays, the FMM patterning method is not used. Instead, the color patterning step is performed by using color filter elements which are integrated with the display substrate prior to the formation of OLED devices on said substrate. A vacuum-deposited white OLED device structure with a broad emission spectrum is uniformly formed behind the color filter elements and which are designed to result in the RGB primary colors. As noted above, while the color filter elements for R, G and B pixels are incorporated in the display substrate, a fourth white or W pixels added to the display substrate design. The W pixel is unfiltered and can allow the entire white OLED emission spectrum to come through. The RGBW patterning method eliminates the complexities of the FMM patterning process in a vacuum environment and allows for the scaling of full color OLED displays to larger television displays using conventional design rules employed in the display substrate industry.

However, the use of color filter elements in the display substrate increases the number of processing steps required in its manufacturing process and therefore results in increased manufacturing costs. The RGBW patterning method is equally applicable for smaller mobile displays but the requirement of a fourth W pixel will reduce the display resolution, hence an unsatisfactory solution for most of these applications. In summary, both the RGB and RGBW OLED displays and their patterning methods have disadvantages in covering the whole range of display applications from smartphones to televisions and result in additional manufacturing costs due to the use of complex processes and increased number of processing steps.

U.S. Pat. No. 5,851,709, U.S. Pat. No. 5,688,551, U.S. Pat. No. 6,114,088, U.S. Pat. No. 6,140,009, U.S. Pat. No. 6,214,520, U.S. Pat. No. 6,221,553 teach the use of alternate OLED patterning techniques that do not employ either the FMM or the RGBW patterning methods. These alternate patterning techniques use the method of selective transfer of organic materials, which are uniformly deposited on a source substrate, to the display substrate. The selective transfer is accomplished by incorporating a patterned light-to-heat conversion (LHC) layer on the source substrate under the organic materials and by subsequently heating these LHC layers selectively with a source of intense radiation. This results in the selective transfer of the organic materials, either a single material layer or a multicomponent material layer, from the heated LHC regions. These prior art references cited above suffer from one or more of the following limitations. The method cited in U.S. Pat. No. 5,851,709, for instance, may teach the incorporation of a source substrate with physical apertures that mirror the targeted display substrate color pixel pattern, in combination with the patterned LHC layers, which are also incorporated on the same source substrate. The source substrate cited in this reference can be from the group of silicon, glass or ceramic substrates. Incorporating precise apertures on any of these substrates is an expensive process, involve complex fabrication processes and have size limitations thereby making this patterning method inherently more complex than the FMM method described in an earlier section. Finally, the resulting emission layer of the OLED color pixel on the display substrate is formed directly from the selective transfers from corresponding LHC regions of the source substrate. The method cited in U.S. Pat. No. 5,688,551, for instance, may teach the use of an integrated source substrate containing a donor sheet with pre-patterned LHC layers and uniformly covered with a layer of the organic emission layer materials. The integrated source substrate is aligned, in close proximity, with the display substrate. After alignment, the source substrate is subjected to an intense source of radiation, which results in the selective sublimation of emission layers from the LHC regions of the source substrate to the targeted pixel locations on the display substrate. The introduction of donor sheets for each color inside a vacuum environment adds complexities to the OLED display manufacturing process. Once again, the resulting emission layer of the OLED color pixel on the display substrate is formed directly from corresponding LHC regions of the source substrate. The methods cited in U.S. Pat. Nos. 6,114,088, 6,140,009, 6,214,520, 6,221,553 may teach a variety of options to use an integrated source substrate containing uniform LHC layers inserted between the substrate and a multicomponent organic layer unit. The said multicomponent unit consists of at least two active OLED device layers. The selective transfer of the entire multicomponent unit is accomplished by exposing the source substrate to an intense radiation according to a pattern, the said exposure pattern corresponding to the color pixel target locations on a display substrate. Once again, the resulting one or more active layers of the OLED device at the color pixel location on the display substrate are formed directly from the selective transfers from corresponding LHC regions of the integrated source substrate. This method additionally introduces more complexity in the manufacturing process since it requires the integration of a radiation source, such as a laser, which can write at the resolution of display pixel sizes. In summary, the search for alternate patterning methods to make RGB or RGBW OLED displays has been extensive over the years and many approaches based on selective transfers from LHC regions have been evaluated but with no clear success. The common theme in all the above methods is the direct transfers of functional organic layers from an LHC region of a source substrate to the corresponding regions on the display substrate. In all cases, the physical patterning process seems to be easy to demonstrate but the optoelectronic properties of the resulting OLED devices resulting from the direct transfer process have been inferior compared to their FMM or RGBW counterparts.

Therefore, there continues to be a need of a simple, cost effective and precise method and apparatus for patterning an organic device. The method and apparatus should allow high-resolution patterning of large and small displays. The method and apparatus should be versatile and capable of patterning displays of various sizes in desired resolutions, with precision. The method and apparatus should provide a high throughput and should be modular in operation.

SUMMARY OF THE INVENTION

An object of the present invention is to provide a method for patterning an organic device, such as an organic light emitting diode (OLED) display device, where the organic materials are not directly transferred from the light-to-heat conversion regions of a source substrate to the OLED pixel regions of the patterned display substrate.

It is an object of the present invention to provide a method and an apparatus for patterning an organic device, such as an organic light emitting diode (OLED) device.

Another object of the present invention is to provide a precision patterning method and an apparatus for producing the red green blue (RGB) or the red green blue white (RGBW) pixels for an OLED display device.

Another object of the present invention is to provide a method and an apparatus for fabrication of emissive and functional organic layers of on OLED display.

Yet another object of the present invention is to provide a method and an apparatus for high-resolution patterning of an organic device to be used for large and small area displays.

Another object of the present invention is to provide a pre-defined patterned source substrate for use in fabrication of an organic device.

Another object of the present invention is to provide a pre-defined patterned source substrate formed by modification of one or more organic materials disposed over light-to-heat conversion regions that are on a substantially optically transparent base substrate.

The present invention provides a method for patterning an organic device. The method includes providing a patterned product substrate and a pre-defined patterned source substrate. The patterned product substrate has a product principal surface, the product principal surface is being defined by a plurality of destination regions. The pre-defined patterned source substrate has a source principal surface. The pre-defined patterned source substrate includes a plurality of optically reflecting regions and a plurality of optically absorbing regions. The optically reflecting regions and the plurality of optically absorbing regions are arranged such that each optically reflecting region is adjacent to at least one of the plurality of optically absorbing regions. The source principal surface being defined by plurality of source regions, the plurality of source regions being defined at the optically reflecting regions. The plurality of source regions have one or more organic materials disposed thereon. The method further includes aligning the product principal surface and the source principal surface such that each of the plurality of source regions are aligned to exactly one destination region of the destination regions. The product principal surface is substantially parallel to the source principal surface. Further, at least one of the product principal surface and the source principal surface has one or more supports to maintain a substantially uniform gap between the plurality of source regions and the destination regions. The method also includes raising the temperature of the pre-defined patterned source substrate above a sublimation temperature of the one or more organic materials. The temperature is raised such that, at any location on the pre-defined patterned source substrate, the one or more organic materials, underlying optically reflecting region of the optically reflecting regions and one or more underlying layers on the pre-defined patterned source substrate are maintained at a substantially equal temperature. The method further includes sublimating the one or more organic materials at the optically reflecting regions of the pre-defined patterned source substrate. Furthermore, the method includes redepositing the one or more organic materials at the nearest destination region of the destination regions on the patterned product substrate.

The present invention further provides a pre-defined patterned source substrate for use in fabrication of an organic device. The pre-defined patterned source substrate includes a source base substrate, which is substantially optically transparent. The pre-defined patterned source substrate also includes an optical modifier layer over the source base substrate. The optical modifier layer further includes a plurality of optically reflecting regions. The optically reflecting regions define a plurality of source regions. The plurality of source regions is configured to house one or more organic materials. The optical modifier layer further includes a plurality of optically absorbing regions. The plurality of optically absorbing regions are arranged such that each optically absorbing region of the plurality of optically absorbing regions is adjacent to at least one optically reflecting region of the optically reflecting regions.

BRIEF DESCRIPTION OF THE DRAWINGS

Some embodiments of the present invention are described with reference to the following drawings for exemplary purposes only. In the drawings, like reference numerals, refer to like parts throughout the various figures unless otherwise specified.

For a better understanding of the presently disclosed subject matter, reference will be made to the following Detailed Description, which is to be read in association with the accompanying drawings, wherein:

FIG. 1 illustrates an exemplary organic device, in accordance with an embodiment of the present invention;

FIG. 2 illustrates another exemplary organic device, in accordance with another embodiment of the present invention;

DESCRIPTION OF THE INVENTION

Figure 3A:
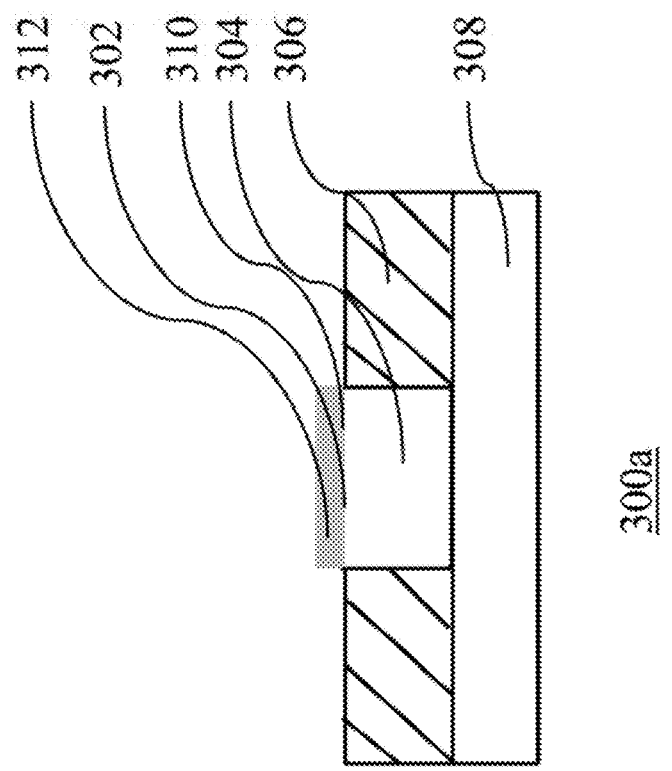
FIG. 3a illustrates a side view of an exemplary pre-defined patterned source substrate, in accordance with an embodiment of the present invention.

The following description of the invention is provided with reference to the figures. Exemplary, and in some case preferred, embodiments are described to illustrate the invention, not to limit its scope, which is defined by the claims. Those of ordinary skill in the art will recognize a number of equivalent variations in the description that follows. It should be noted that the drawings are for illustration purpose only and not to the scale.

The term "organic device" or "OLED device" refers to a device including organic light emitting diodes, sometimes called an electroluminescent device, or an EL device or an OEL device. The term "display" or "display panel" is employed to designate a screen capable of electronically displaying, images, video, text, etc. The term "pixel" is employed in the art-recognized usage to designate an area of a display panel that can be stimulated to emit light independently of other areas. The term "multicolor" is employed to describe a display panel that is capable of emitting light of a different hue in different areas. The term "full color" is further employed to describe multicolor display panels that are capable of emitting in the red, green, and blue regions of the visible spectrum and displaying images in any combination thereof. The red, green, and blue colors generally constitute the three primary color from which all other colors can be generated by appropriately mixing these three primaries. The pixel or subpixel is generally used to designate the smallest addressable unit in a display panel. For a monochrome display, there is no distinction between pixel or subpixel. The term "subpixel" is used in full color display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. For the purpose of this invention, the terms "pixel" and "sub-pixel" are used interchangeably. An "organic device" or "OLED" mentioned in the specifications can be used for display applications as well as other applications not specifically mentioned in the description. The present invention is suitable for forming organic layers (emissive or functional). Advantages of the invention are provided below.

FIG. 1 illustrates an exemplary organic device 100, in accordance with an embodiment of the present invention. The organic device 100 can be an organic light-emitting diode (OLED) display. An OLED display can be used for various applications such as a mobile phone display, a tablet display, a display screen of a medical device, a television display, and so forth. Typically, each application requires different characteristics such as shape, size, resolution, flexibility, configuration and so forth. For the purpose of ease of understanding, the organic device 100 is shown to have a single stack configuration, however, it should be understood that the invention can be practiced for various applications and configurations. The organic device 100 is shown to include an anode 102 and a cathode 104. The organic device 100 can be a top emitting, a bottom emitting or a dual (multiple) side emitting. Materials for the anode 102 can be metal oxides such as indium-tin oxide, tin oxide, aluminum or indium-doped zinc oxide, and magnesium-indium oxide. The cathode 104 may be made of Mg:Ag alloy or Aluminum in combination with a thin LiF contact layer.

In this bottom emitting organic device 100, the anode 102 may be transparent and the cathode 104 may be opaque. Further, various emitter and functional organic layers 106-112 can be sandwiched between the anode 102 and the cathode 104 of the organic device 100. The organic device 100 can have various functional layers such as a hole transport layer (HTL) 106, a hole blocking layer (HBL) 108, an electron transport layer (ETL) 110, an electron injection layer (EIL) (not shown) and an optional hole injection layer (HIL) (not shown in the organic device 100). Further, the organic device 100 has emissive layers such as a blue EML 112. These emissive layers are primarily responsible for light generation and electroluminescence.

While not always necessary, it is often useful that a hole-injection layer (HIL) 116 can be provided in the organic light-emitting display or OLED device 100 (shown in FIG. 2). The material of the HIL 116 can serve to improve the film formation property of subsequent organic layers and to facilitate injection of holes into the hole-transporting layer 106. Suitable materials for use in the hole-injection layer 116 may include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative materials for HIL 116 are reportedly useful in organic EL or OLED devices as described in EP 0891121 A1 and EP1,029,909 A1.

These functional and emissive layers are typically made of organic compounds. For example, the HTL 106 may include compounds such as an aromatic tertiary amine, where the latter is understood to be a compound containing at least one trivalent nitrogen atom that is bonded only to carbon atoms, at least one of which is a member of an aromatic ring. In one form, the aromatic tertiary amine can be an arylamine, such as a monoarylamine, diarylamine, triarylamine, or a polymeric arylamine. In another example, the HTL 106 may be polycyclic aromatic compounds such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

FIG. 2 illustrates another exemplary organic device 100, in accordance with another embodiment of the present invention. The organic device 100 is shown to have a double stack structure for the purpose of understanding. The double stack organic device 100, broadly, has a layer structure of two organic devices connected by a connector layer 202. It should be understood that the invention is applicable to any type of organic device such as a single stack, double stack or multiple stack configuration. Also, it will be apparent to a person ordinarily skilled in the art that an OLED device (the organic device 100) illustrated in FIG. 1 and FIG. 2 can have more or less number of layers without affecting the scope of the invention. Although, the functional layers are not shown in subsequent figures or described in detail in the corresponding specifications, it will be apparent to a person ordinarily skilled in the art that the functional layers can be considered as a part of the organic device.

FIG. 3a illustrates a side view of an exemplary pre-defined patterned source substrate 300a, in accordance with an embodiment of the present invention. The pre-defined patterned source substrate 300a can be used for fabrication of full color organic devices for display applications. The pre-defined patterned source substrate 300a has a source principal surface 302. The pre-defined patterned source substrate 300a further has a plurality of optically reflecting regions 304 and a plurality of optically absorbing regions 306. It should be note that term 'plurality of optically reflecting regions 304' and 'non light-to-heat conversion regions' are used interchangeably. Also, the term 'plurality of optically absorbing regions 306' and 'light-to-heat conversion regions' are used interchangeably. In an embodiment, the plurality of optically reflecting regions 304 and the plurality of optically absorbing regions 306 are formed on a source base substrate 308. The source base substrate 308 can be a rigid substrate or a flexible substrate. In some embodiments, the source base substrate 308 may be substantially optically transparent. The source base substrate 308 may be made of glass or a polyester film such as a polyethylene terephthalate film or a polyethylene naphthalate film. Other examples of the materials for the source base substrate 308 may include, but not limited to, metal oxides and metal nitrides. Specific materials can be aluminum oxide (also known as sapphire), gallium nitride, and so forth. The thickness of the source base substrate 308 of the pre-defined patterned source substrate 300a can range between 0.1 mm to 2 mm.

The plurality of optically reflecting regions 304 and the plurality of optically absorbing regions 306 of the pre-defined patterned source substrate 300a may be arranged such that each of the optically reflecting regions 304 is adjacent to at least one optically absorbing region of the plurality of optically absorbing regions 306. This example is described in detail with reference to FIG. 3b. In some embodiments, the plurality of optically reflecting regions 304 and the plurality of optically absorbing regions 306 have substantially high thermal conductivity. For example, the source base substrate 308, the optically reflecting regions 304 and the plurality of optically absorbing regions 306 may have thermal conductivities of 1 to 1.2, 20 to 400 and 60 to 200 W·m−1·K−1, respectively. Some examples of source base substrate may include glass used in the display industry or polyester film such as a polyethylene terephthalate film or a polyethylene naphthalate film. Some examples of reflecting regions may include aluminum, molybdenum, chromium, titanium or combinations of these commonly used metals in the display industry. Some examples of absorbing regions may include silicon, germanium, alloys of silicon and germanium or light absorbing solar materials such as copper indium disulfide, copper indium gallium selenide, and so forth. Further, the plurality of optically reflecting regions 304 are defined as a plurality of source regions 310. The plurality of source regions 310 further defines a source principal surface 302.

Hereinafter, the terms 'plurality of optically reflecting regions 304' and 'plurality of source regions 310' are used interchangeably.

Further, one or more organic materials 312 can be disposed over the plurality of source regions 310. The one or more organic materials 312 can be a charge transport material which serves as the host material in an emission layer of an OLED device or a mixture of an emission layer host material and an emissive dopant layer or any one of the functional layers used in an OLED device between the anode 102 and the cathode 104. In some cases, the one or more organic materials 312 corresponds to one or more primary colors or a combination of one or more primary colors. For example, the one or more organic materials 312 can be red, blue or green colors.

Figure 3B:
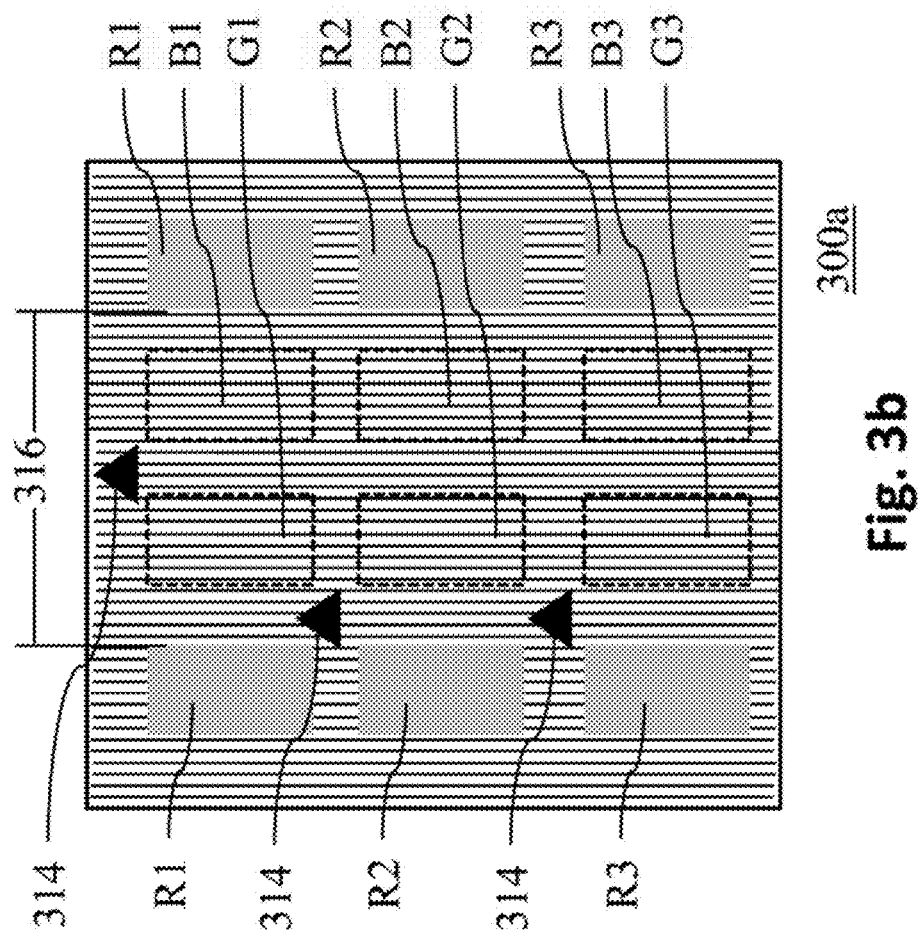
FIG. 3b illustrates a top view of the pre-defined patterned source substrate, in accordance with an embodiment of the present invention.
Figure 4:
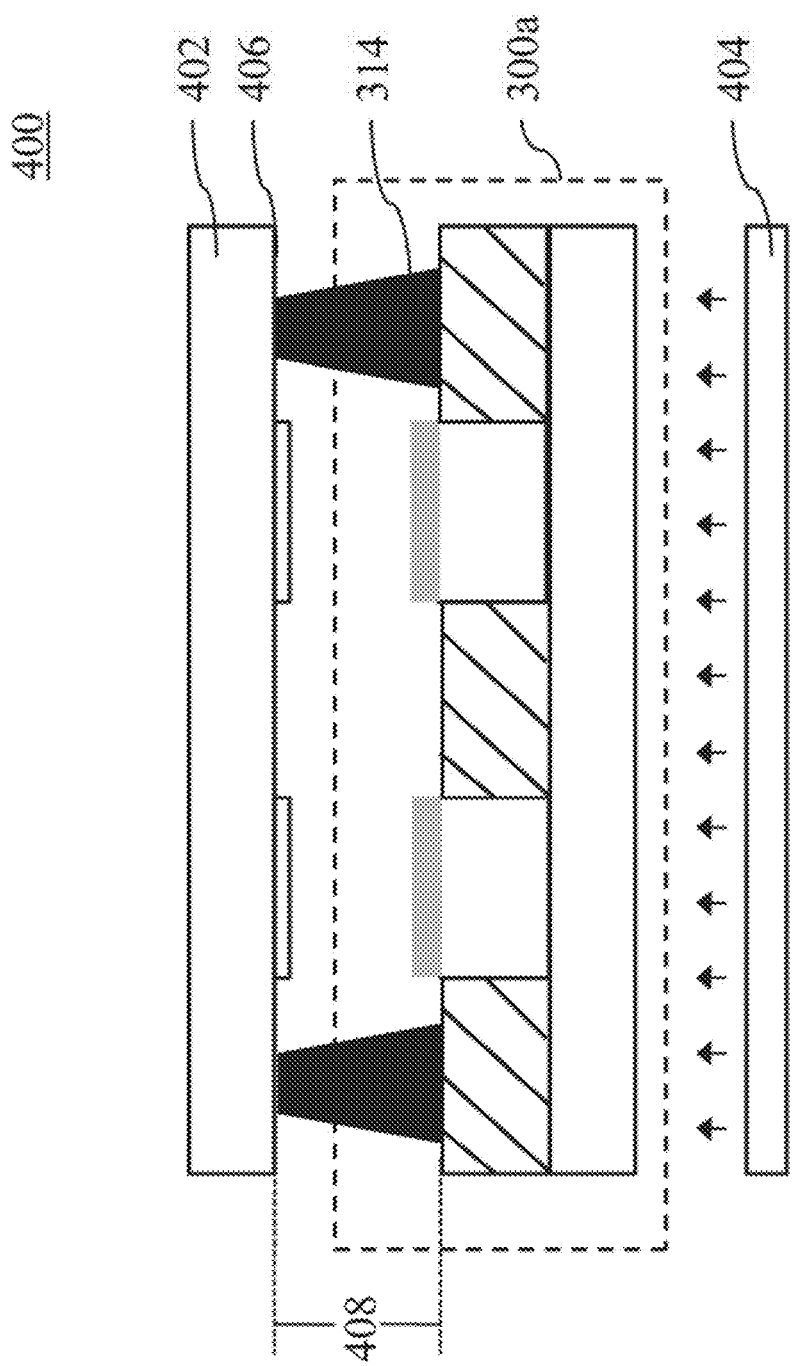
FIG. 4 illustrates an apparatus of patterning the organic device, in accordance with an embodiment of the present invention.

FIG. 3b illustrates a top view of the pre-defined patterned source substrate 300a, in accordance with an embodiment of the present invention. R1, R2 and R3 shown in FIG. 3b indicate the location of the one or more organic materials 312 disposed over the plurality of optically reflecting regions 304. For example, R1, R2 and R3 can indicate the locations of red color organic material on the plurality of optically reflecting regions 304. G1, G2, G3, B1, B2 and B3 shown in dotted line indicate corresponding locations of blue and green pixels on a patterned product substrate. The patterned product substrate is explained in detail w.r.t. FIG. 4. It should be noted that G1, G2, G3, B1, B2 and B3 are shown for clarity and understanding purpose only. A distance 316 indicates the distance between two nearest optically reflecting regions of the plurality of optically reflecting regions 304 in one particular dimension for example, and this is only shown for illustrative purposes. In general, the space between the each of the nearest optically reflecting regions among the plurality of optically reflecting regions 304 on the pre-defined patterned source substrate 300a is covered by an optically absorbing region 306 (shown in FIG. 3b with a vertical lines pattern fill). It will apparent to a person ordinarily skilled in the art that the distance 316 may be exactly equal to two pixels or may be greater than two pixels depending on the configuration. Each region of the plurality of destination regions and each region of the plurality of source regions 310, each region representing a pixel, are of substantially the same area, further wherein the area is at least 900 square microns. R1, R2, R3, G1, G2, G3, B1, B2 and B3 can be of any shape. They are shown to be rectangular for the purpose of illustration only.

Figure 7:
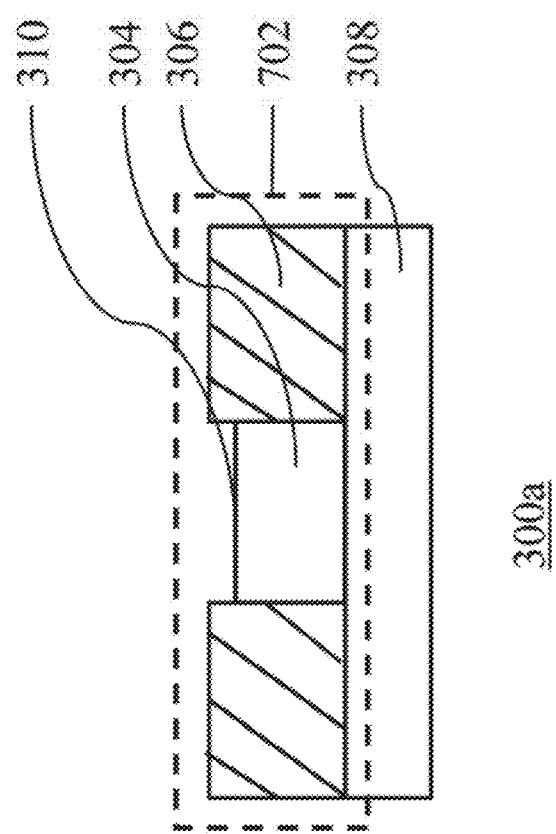
FIG. 7 illustrates the pre-defined patterned source substrate for use in fabrication of an organic device, in accordance with an embodiment of the present invention.

Further, the pre-defined patterned source substrate 300a may include one or more supports 314 at various locations. The one or more supports can be elevated portions located anywhere on the pre-defined patterned source substrate 300a, except at the plurality of optically reflecting regions 304. The location of one or more supports 314 is shown for illustrative purpose only. For example, the one or more supports 314 may be located at the corners of the pre-defined patterned source substrate 300a outside the patterned area. The locations of the supports 314 on the pre-defined patterned source substrate 300a will depend on the physical properties of the source base substrate material 308. As a general principle, the one or more supports 314 will never be located in the optically reflecting regions 304. The purpose of the one or more supports 314 is to maintain substantially uniform gaps between the plurality of source regions 310 and the plurality of destination regions. The typical range of heights of the one or more supports 314 may be between 6 to 20 microns. In some embodiments, the one or more supports 314 may be one or more of the plurality of optically absorbing regions 306 of the pre-defined patterned source substrate 300a. For example, the thickness of some or all optically absorbing regions 306 can be more than that of the optically reflecting regions 304. This is explained in detail w.r.t. FIG. 7. The one or more supports 314 may be substantially optically transparent if located at the plurality of optically absorbing regions 306. The one or more supports 314 may be opaque, transparent or translucent if located at any other location on the pre-defined patterned source substrate 300a. The one or more supports 314 can be of various shapes and sizes such as pyramidal, cubical, cylindrical, and so forth. They are shown to be pyramidal in the FIG. 3b for illustration purpose only.

Figure 3C:
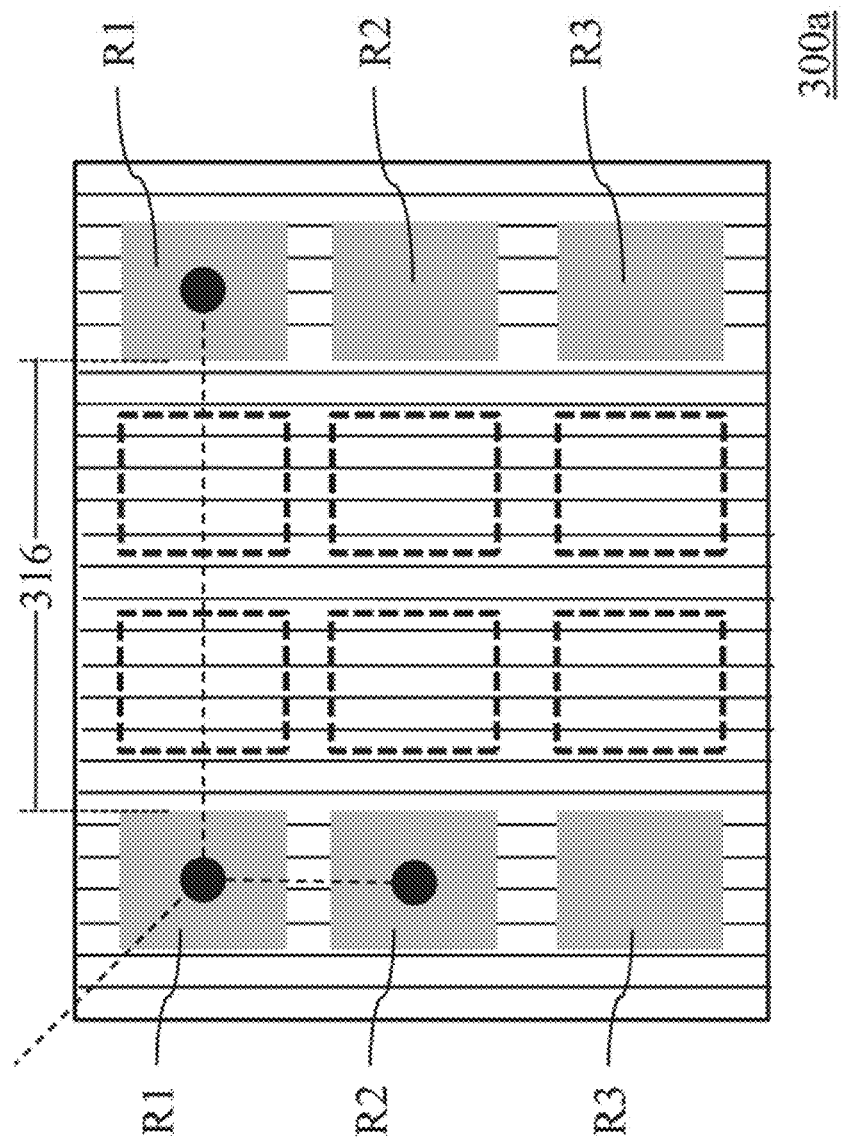
FIG. 3c illustrates a zoomed top view of the pre-defined patterned source substrate, in accordance with an embodiment of the present invention.

FIG. 3c illustrates a zoomed top view of a section of the pre-defined patterned source substrate 300a, in accordance with an embodiment of the present invention. With reference to FIG. 3b, each of the plurality of optically reflecting regions 304 or the source regions R1, R2 and R3 (or source regions 310) may have widths of at least 30 microns along the horizontal direction. In principle, the patterning method described in this invention can create smaller widths (<30 microns) of the source regions 310 but for most practical display applications from smartphones to large televisions, the 30 microns limit may be acceptable. For some display applications such as microdisplays, source region widths of less than 30 microns can be produced with the patterning method described in this invention. With reference to FIG. 3c, each of the plurality of optically reflecting regions 304 is separated in the horizontal direction from the next optically reflecting region by a distance 316. Along the horizontal direction, the distances 316, which are periodic across the entire width of the source substrate 308, are covered by optically absorbing regions 306 (shown in FIG. 3c as a vertical lines pattern fill). In the transverse direction, as shown in FIG. 3c and along the height of the source region s 310, each of the optically reflecting regions 304 is an island, which is separated from the next optically reflecting region. This can be seen in FIG. 3c along the line connecting the centers of R1 and R2 pixels. This region of separation, which creates the source region island, is also covered by an optically absorbing region 306. In general, the minimum distance between neighboring optically reflecting regions 304 will be different along the horizontal and transverse directions, and these dimensions are dictated by the display design and specification. The 30 microns limit described above must be considered in the context of a specific display design. The patterning method described here is broadly applicable to all display sizes from microdisplays to large televisions and suitable for any configuration of pixel arrangement.

With reference to FIG. 3b, the one or more organic materials 312 is disposed over the plurality of optically reflecting regions 304 shown as R1, R2 and R3, where R1, R2 and R3 are locations where red organic material can be disposed. It should be noted that the shapes of R1, R2, R3, G1, G2, G3, B1, B2 and B3 are shown to rectangular in the Figs, however, they can be of any shape without affecting the scope of the invention.

FIG. 4 illustrates an apparatus 400 for patterning the organic device 100, in accordance with an embodiment of the present invention. For the purpose of clarity, the organic device 100 can be used for full color display applications. The apparatus 400 includes the pre-defined patterned source substrate 300a, a patterned product substrate 402 and a heating source 404. It should be noted that the heating source 404 can be a thermal heating source or an optical heating source. It will be apparent to a person ordinarily skilled in the art that the patterned product substrate 402 is referred to a product substrate partially patterned with one or more of the Red Green Blue (RGB) pixels or a blank product substrate that is yet to be patterned with any of the RGB pixels. A product substrate patterned with RGB pixels can be used in full color organic devices for display applications. For example, the finished patterned product substrate 402 may include the anode 102, the HTL 106, the EML 112, HBL 108, ETL 110, cathode 104 and other functional layers required in either single stack or multi-stack OLED device configurations. It should be understood that the patterned product substrate 402 may or may not include emissive layers (such as the EML 112) depending on the stage of fabrication. One of the main purposes of this invention is to create an alternate method for the delivery of emissive layers to OLED devices, in a pre-defined pattern, for use in display applications.

The patterned product substrate 402 has a product principal surface 406 that has a plurality of destination regions (not shown). In an embodiment, each region of the plurality of destination regions and each region of the plurality of source regions 310 are of substantially same area. The area can be at least 900 square microns. The one or more supports 314 maintains a substantially uniform gap 408 between the plurality of source regions 310 and the plurality of destination regions. The one or more supports 314 ensures that the product principal surface 406 is substantially parallel to the source principal surface 302. The supports 314 are shown on top of an optically absorbing region 306 in FIG. 4 only for illustrative purposes. In general, the supports 314 may be located outside the pre-defined patterned region of the source base substrate 308. Further, the heating source 404 of the apparatus 400 raises the temperature of the pre-defined patterned source substrate 300a above the sublimation temperature of the one or more organic materials 312. The temperature is raised in such a way that a thermal equilibrium is established and maintained. In other words, the temperature within the pre-defined patterned source substrate 300a is spatially and temporally uniform while under substantially steady state conditions. In an embodiment, the one or more organic materials 312 is a multicomponent mixture. In an embodiment of this invention, where the one or more organic materials 312 is a multicomponent mixture, either (i) organic molecules with substantially similar sublimation characteristics or (ii) organic materials structurally modified to result in substantially similar sublimation characteristics, may be used for best results. The onset and rate of change of the sublimation, of an organic material, with temperature are the parameters known as the sublimation characteristics of the said material. In an embodiment, sublimation characteristics are the equilibrium vapor pressures or the partial pressures of each of the components of the multicomponent mixture and the temperature dependence of these partial pressures. For this invention, sublimation is a case of a discontinuous phase transition of a material from its solid phase to its gas phase under endothermic conditions. For this invention, the ambient pressure is decreased to sub-atmospheric conditions or vacuum, and the temperature is simultaneously increased, to initiate the sublimation. The temperature can be in the range of 100° C. to 400° C. It will be apparent to a person ordinarily skilled in the art that vapor pressures of organic materials and the temperature dependence of partial pressures or the sublimation characteristics can be obtained for organic materials from the published data of their physical properties. Each component of the multicomponent mixture of this present invention can have unique sublimation characteristics. When the temperature of the one or more organic materials 312 is raised, the temperature of the underlying layers on the pre-defined patterned source substrate 300a, the plurality of optically reflecting regions 304 and the source base substrate 308 remain substantially same and are raised in a steady state. In this invention, the one or more organic materials 312 is not directly transferred from the light-to-heat conversion regions to the patterned product substrate 402. In fact, the one or more organic materials 312 is transferred from the non light-to-heat conversion regions to the patterned product substrate 402 by a sublimation process under thermal equilibrium, in a subsequent process step. In an embodiment, the temperature of the pre-defined patterned source substrate 300a is raised in parts. In another embodiment, the temperature of the pre-defined patterned source substrate 300a is raised as a whole. Moreover, the heating source 404 can be a linear scanning source, an area source, and so forth. It will be apparent to a person ordinarily skilled in the art that a thermal source or an optical source can be used for raising the temperature of the source base substrate 308. However, a thermal source may be preferred as it may lead to a lower upfront and operational cost, while being equally or more effective compared to an optical source.

Figure 5:
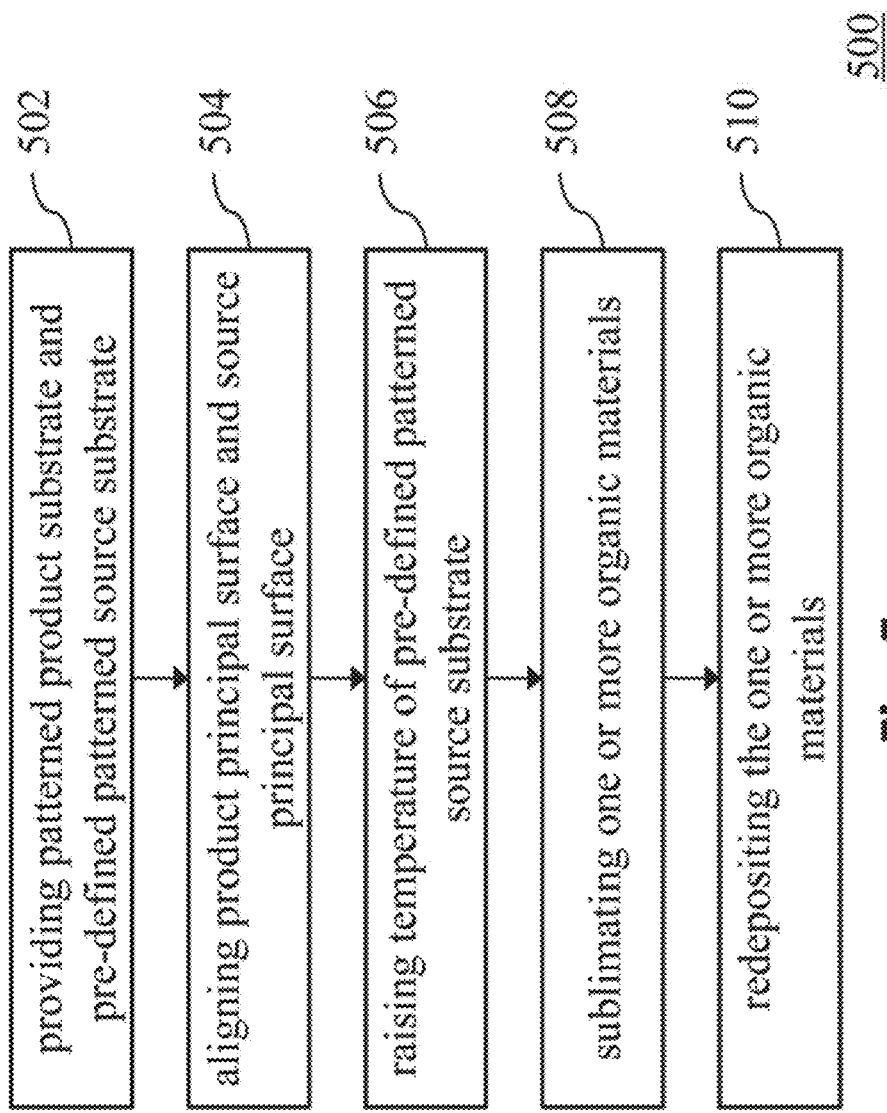
FIG. 5 is a flowchart illustrating a method for patterning an organic device, in accordance with an embodiment of the present invention.

FIG. 5 is a flowchart illustrating a method 500 for patterning the organic device 100, in accordance with an embodiment of the present invention. The method 500 includes providing the patterned product substrate 402 and the pre-defined patterned source substrate 300a at step 502. As discussed w.r.t. FIG. 4, the pre-defined patterned product substrate 402 has the product principal surface 406 that has a plurality of destination regions. The patterned product substrate 402 is described in detail w.r.t. FIG. 4. Further, the pre-defined patterned source substrate 300a includes a source principal surface 302 that has the plurality of optically reflecting regions 304 and the plurality of optically absorbing regions 306. The plurality of optically reflecting regions 304 can reflect the incident light and the plurality of optically absorbing regions 306 can absorb the incident light. This is explained in detail w.r.t. FIG. 3a, FIG. 3b and FIG. 3c. The plurality of optically reflecting regions 304 define the plurality of source regions 310. Further, the one or more organic materials 312 is disposed on the plurality of source regions 310. In an embodiment, the one or more organic materials 312 correspond to one or more primary colors (red, blue or green) or a combination of the primary colors.

At step 504, the product principal surface 406 and the source principal surface 302 are aligned in a way that each region of the plurality of source regions 310 is aligned to exactly one destination region of the plurality of destination regions. For example, a source pixel having a red organic material will be aligned to exactly one destination pixel where the red organic material is to be deposited. Further, the alignment is done in such a way that the product principal surface 406 is substantially parallel to the source principal surface 302. In some embodiments, the patterned product substrate 402 is a mirror image of the pre-defined patterned source substrate 300a, for example, in terms of size, dimensions and location. Moreover, the one or more supports 314 can be located at the product principal surface 406, the source principal surface 302 or both the surfaces. In a first example, supports can be located at the product principal surface 406 except at the plurality of destination regions. In a second example, the one or more supports 314 can be located at the source principal surface 302 except at the plurality of source regions 310. In a third example, some of the supports 314 can be located at the source principal surface 302 and some of the supports 314 can be located at the product principal surface 406. In a fourth example, some regions of the plurality of optically absorbing regions 306 can be elevated portions compared to the plurality of optically reflecting regions 304. These elevated optically absorbing regions 306 can act as supports 314. The one or more supports 314 maintain a substantially uniform gap of 6 to 20 microns between the plurality of source regions 310 and the plurality of destination regions.

Thereafter at step 506, the temperature of the pre-defined patterned source substrate 300a is raised above the sublimation temperatures of the one or more organic materials 312. In an embodiment, the sublimation happens at a pressure of less than 1 milli-Torr. In an embodiment, the temperature is raised using the heating source 404. The heating source 404 needs to be such that it allows a relatively slow and steady state rise of temperature, while maintaining a thermal equilibrium. When the temperature of the one or more organic materials 312 rise, at any location due to an external heating source 404, the temperature of any underlying layers under the source regions 310 on the pre-defined patterned source substrate 300a, the plurality of optically reflecting regions 304 and the source base substrate 308 also rise at a similar rate, this is called thermal equilibrium. In most thermal systems, thermal equilibrium is usually established within the microsecond regime even after exposure to a nano-second laser irradiation. However, such a laser thermal source is not suitable for the present invention, as the instantaneous rise of temperature will allow non-equilibrium processes to prevail before thermal equilibrium is established. Most of the previous search for alternate OLED patterning technologies have relied upon non-equilibrium transfers, using short pulse laser heating sources or flash illumination sources and have not succeeded in creating transferred films with the desired optoelectronic properties. A heating source whose temperature increases at a much slower rate, for example, in the microsecond regime where thermal equilibrium is assured, will be preferable for the present invention. There are numerous examples of thermal equilibrium processes, known as rapid thermal processing (RTP), in the semiconductor and display industries for diffusion, implant activation and contact annealing, all such processes limited by temperature and time restrictions. In one embodiment of this invention, RTP processes based on optical non-laser heating and which operate in the millisecond to the sub-minute regime will be suitable for this invention. The process parameters of the RTP system will be the total optical dose and the time over which the dose is delivered to an absorbing medium. The said absorbing medium can be situated adjacent to the bottom of the source base substrate or be the optically absorbing layers already incorporated either in the pre-defined patterned source substrate or on the source base substrate. In another embodiment of this invention, a hot plate contact from the bottom of the source base substrate will also be suitable, with the process parameters adjustable using the parameters of hot plate temperature and time of contact.

In some embodiments, the temperature of the pre-defined patterned source substrate 300a may be raised in parts or as a whole. In an embodiment, the pixel resolution achieved using this invention is independent of the amount of heated area of the source base substrate 308. Therefore, pixel resolutions will not depend on whether entire area of the source base substrate 308 is heated simultaneously or the source base substrate 308 is heated partially. For example, the temperature of entire area of the pre-defined patterned source substrate 300a is raised simultaneously. In another example, the temperature of partial area of the pre-defined patterned source substrate 300a is raised. The temperature is raised such that, at a location on the pre-defined patterned source substrate 300a, the one or more organic materials 312 on the underlying optically reflecting regions 304 and one or more underlying layers on the pre-defined patterned source substrate 300a are maintained at a substantially equal temperature. In some embodiments, the underlying optically reflecting regions 304, the source base substrate 308 and the plurality of optically absorbing regions 306 have thermal conductivities of 20 to 400, 1 to 1.2, and 60 to 200 W·m−1·K−1 respectively. Broadly, it may be necessary for the plurality of optically reflecting regions 304 and the plurality of optically absorbing regions 306 to have substantially high thermal conductivities. Some examples of the source base substrate 308 may include glass used in the display industry or polyester film such as, a polyethylene terephthalate film or a polyethylene naphthalate film. Some examples of the materials for the reflecting regions 304 may include aluminum, molybdenum, chromium, titanium or combinations of these commonly used metals in the display industry. Some examples of the materials for the absorbing regions 306 may include silicon, germanium, alloys of silicon and germanium or light absorbing solar materials such as copper indium disulfide, copper indium gallium selenide, and so forth.

Then at step 508, the one or more organic materials 312 at the plurality of optically reflecting regions 304 are sublimated. The one or more organic materials 312 can be organic materials of emissive layers such as the blue EML 112. Alternatively, the one or more organic materials can be organic materials of the functional layers such as the HTL 106, the HBL 108, the ETL 110, the HIL and the EIL (both of these latter mentioned layers are not shown in an organic device). It should be noted that the one or more organic materials 312 are described w.r.t. FIG. 1 for the sake of illustration only. The one or more organic materials can refer to all types of organic materials constituting the organic device 100. The method 500 can be used w.r.t. any type of organic material (or any material with similar properties) associated with fabrication of an organic device for display applications.\

The sublimation takes place in a thermal equilibrium such that substantially each molecule of the one or more organic materials 312 is sublimated. Further, at the last step 510 of the method 500, the one or more organic materials 312 is redeposited at a substantially nearest destination region of the plurality of the destination regions. For example, red organic material at a first pixel location (R1, R2 or R3 w.r.t. FIG. 3b and FIG. 3c) is heated above its sublimation temperature and then is redeposited at the correspondingly aligned pixels (destination regions) on the patterned product substrate 402. The sublimation of the one or more organic materials 312 and redeposition on the aligned and the nearest destination region takes place at a thermal equilibrium.

In an embodiment, redepositing the one or more organic materials 312 includes forming one or more functional layers, one or more emitter layers or a combination of functional layers and emitter layers. The functional layers and emissive layers are explained in detail w.r.t. FIG. 1 and FIG. 2. These functional layers can be formed at a substantially nearest destination region of the plurality of destination regions on the patterned product substrate 402. In another embodiment, the method 500 can include a step of forming one or more emissive layers at a substantially nearest destination region of the plurality of destination regions on the patterned product substrate 402. The one or more emissive layers correspond to one or more primary colors or a combination thereof. For example, the emissive layers can have pixels of red, blue and green colors.

Figure 6A:
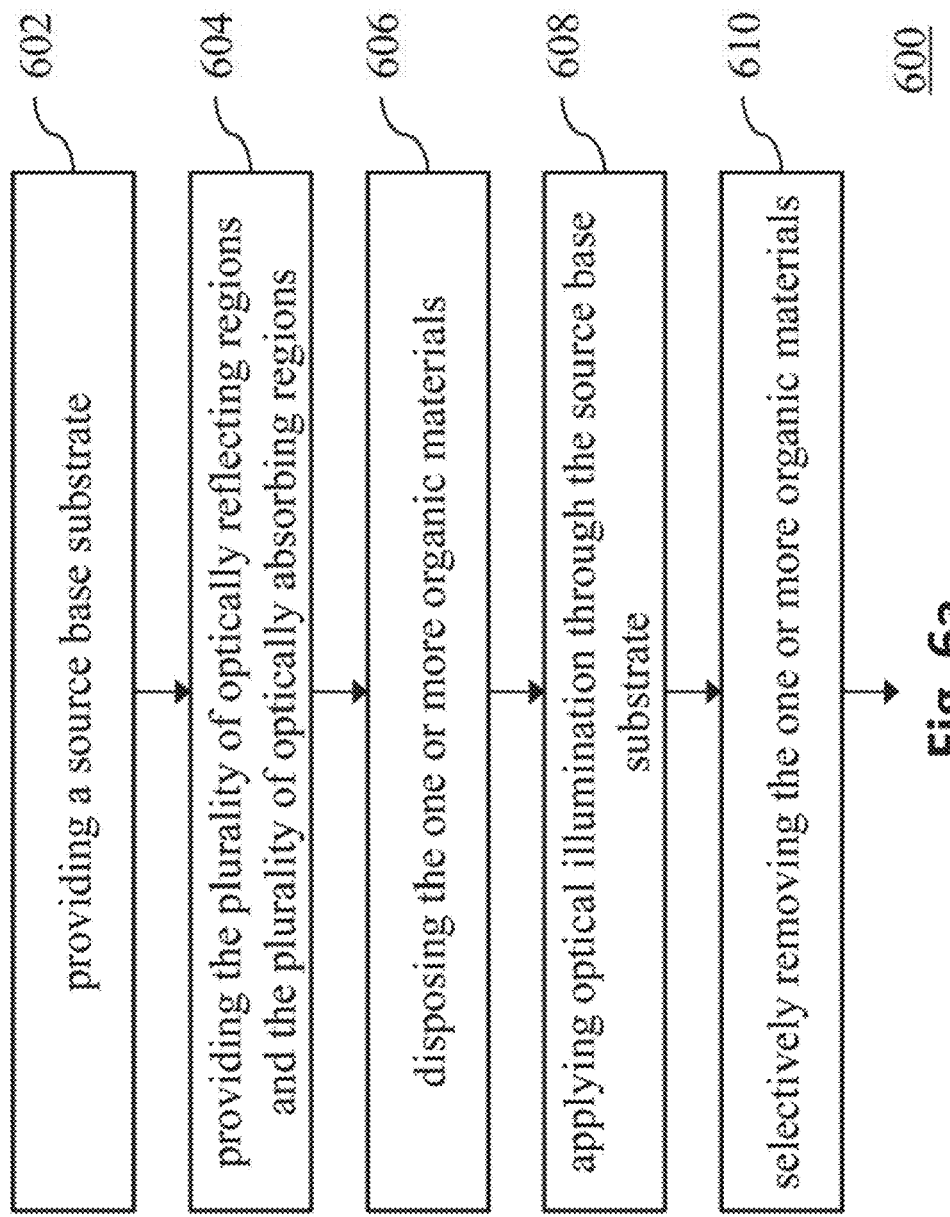
FIGS. 6a and 6b are flowcharts illustrating a method for patterning an organic device, in accordance with another embodiment of the present invention.
Figure 6B:
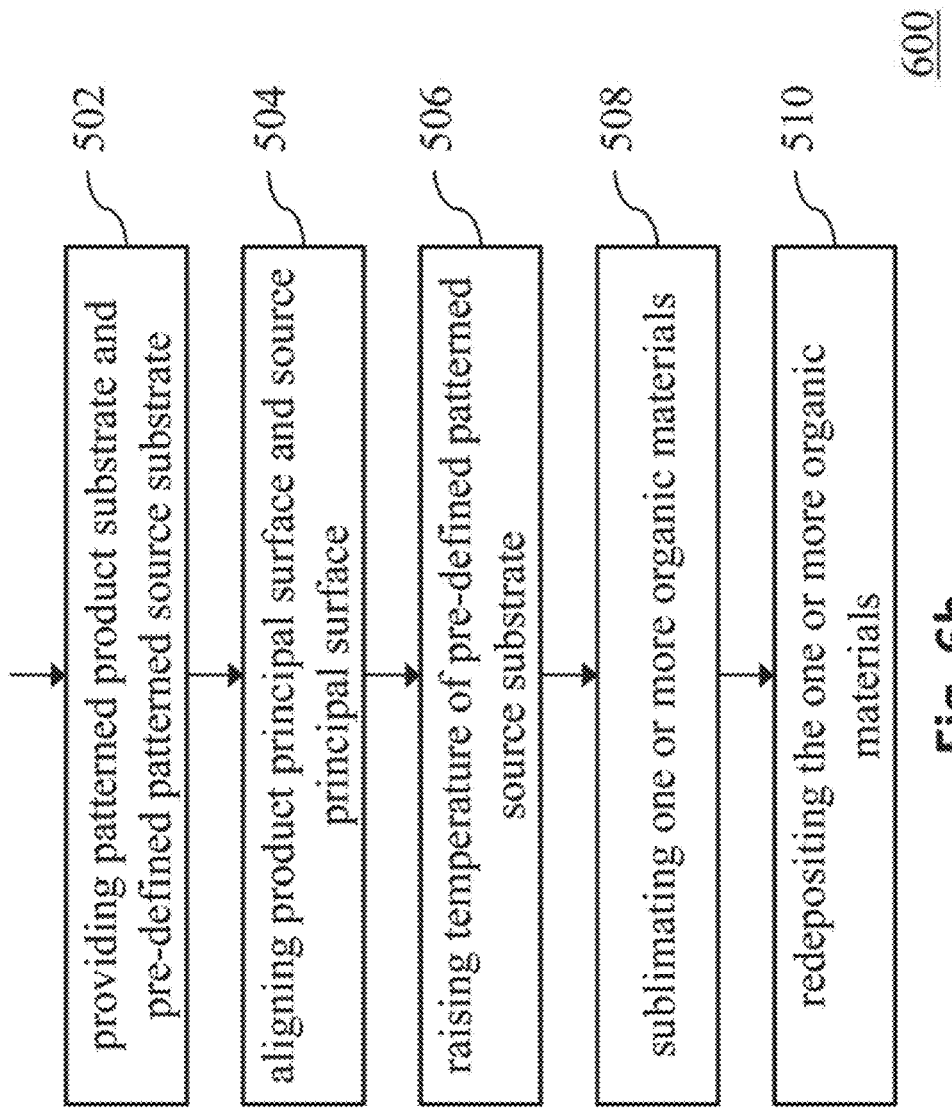

FIGS. 6a and 6b are flowcharts illustrating a method 600 for patterning the organic device 100, in accordance with another embodiment of the present invention. The method 600 includes providing the source base substrate 308 at step 602. The source base substrate 308 can be substantially optically transparent. Further, at step 604, the plurality of optically reflecting regions 304 and the plurality of optically absorbing regions 306 are provided on the source base substrate 308. The arrangement of the plurality of optically reflecting regions 304 and the plurality of optically absorbing regions 306 is described in detail w.r.t. above Figs. Then at step 606, the one or more organic materials 312 are disposed on the plurality of optically reflecting regions 304 and the plurality of optically absorbing regions 306. Thereafter, at step 608, an optical illumination such as a high intensity light source is applied through the source base substrate 308 to selectively raise the temperature of the one or more organic materials 312 disposed at the plurality of optically absorbing regions 306 above the sublimation temperature. This leads to, at step 610, selective removal of the one or more organic materials 312 disposed on the plurality of optically absorbing regions 306, leading to formation of the pre-defined patterned source substrate 300a. For example, the source base substrate 308 can be made of glass, which is optically transparent. When it is exposed to an optical illumination, such as a flash illumination, of optical energies around 1.2 J/cm2 to 1.5 J/cm2 [Reference: Rigo Herold et al, Subpixel Structured OLED Microdisplay, SID 2013 Digest, Pages 330-333], light passes through the source base substrate 308 and is incident at the plurality of optically reflecting regions 304 and the plurality of optically absorbing regions 306. At the plurality of optically absorbing regions 306, the light is converted into thermal energy, leading to an increase in the temperature of the red color organic material disposed over the plurality of optically absorbing regions 306. This causes selective removal of red color organic material from the plurality of optically absorbing regions 306, leading to the formation of the pre-defined patterned source substrate 300a. Thereafter, this pre-defined patterned source substrate 300a, along with the patterned product substrate 402 is provided at step 502 of FIG. 6b. In other words, the one or more organic materials 312 disposed over substantially optically transparent base substrate containing patterned light-to-heat conversion regions is first modified to result in the pre-defined patterned source substrate 300a. This ensures that the one or more organic materials 312 has been removed from the light-to-heat conversion regions of the pre-defined patterned source substrate 300a and therefore cannot be transferred to the patterned product substrate 402 during the subsequent patterning step. Rest of the steps of method 600 (steps 502, 504, 506, 508 and 510) are already explained in detail w.r.t. FIG. 5.

FIG. 7 illustrates the pre-defined patterned source substrate 300a for use in fabrication of the organic device 100, in accordance with an embodiment of the present invention. For example, the pre-defined patterned source substrate 300a may be used to fabricate a product substrate by redepositing the organic materials on the product substrate in form of pixels. As discussed with reference to FIGS. 3a, 3b, and 3c, the pre-defined patterned source substrate 300a includes the source base substrate 308 and an optical modifier layer 702. The source base substrate 308 may be substantially optically transparent. The optical modifier layer 702, over the source base substrate 308, includes the plurality of optically reflecting regions 304 and the plurality of optically absorbing regions 306. In an embodiment, some of the plurality of optically absorbing regions 306 can be elevated regions. In such as case, they can act as the one or more supports 314. It should be noted that the plurality of optically absorbing regions 306 are shown to be elevated for the purpose of illustration only, the plurality of optically absorbing regions 306 may or may not be elevated. There may be the one or more supports 314 located at various locations other than at the plurality of optically reflecting regions 304.

The plurality of source regions 310, defined at the plurality of optically reflecting regions 304, may be configured to house the one or more organic materials 312. It should be understood that the presence or absence of the one or more organic materials 312 on the pre-defined patterned source substrate 300a depends on the stage on fabrication. In an embodiment, each region of the plurality of source regions 310 is at least 900 square microns. Typically, a source region (or the plurality of source regions 310) can be in a form of a square or a rectangle depending on the shape of pixel formation. In an example, an area of the square or the rectangular pixel can be 1100 square microns. Further, the plurality of optically reflecting regions 304 and the plurality of optically absorbing regions 306 may be arranged such that each of the plurality of optically reflecting regions 304 is surrounded by optically absorbing regions 306. In some embodiments, each of the plurality of optically reflecting regions 304 is separated from its nearest optically reflecting region by a periodic distance 316, as shown in FIG. 3c, in the horizontal dimension.

In some embodiments, the pre-defined patterned source substrate 300a is fabricated by steps 602, 604, 606, 608 and 610 of the method 600. The method of fabrication is defined in detail with reference to FIG. 6a.

Figure 8:
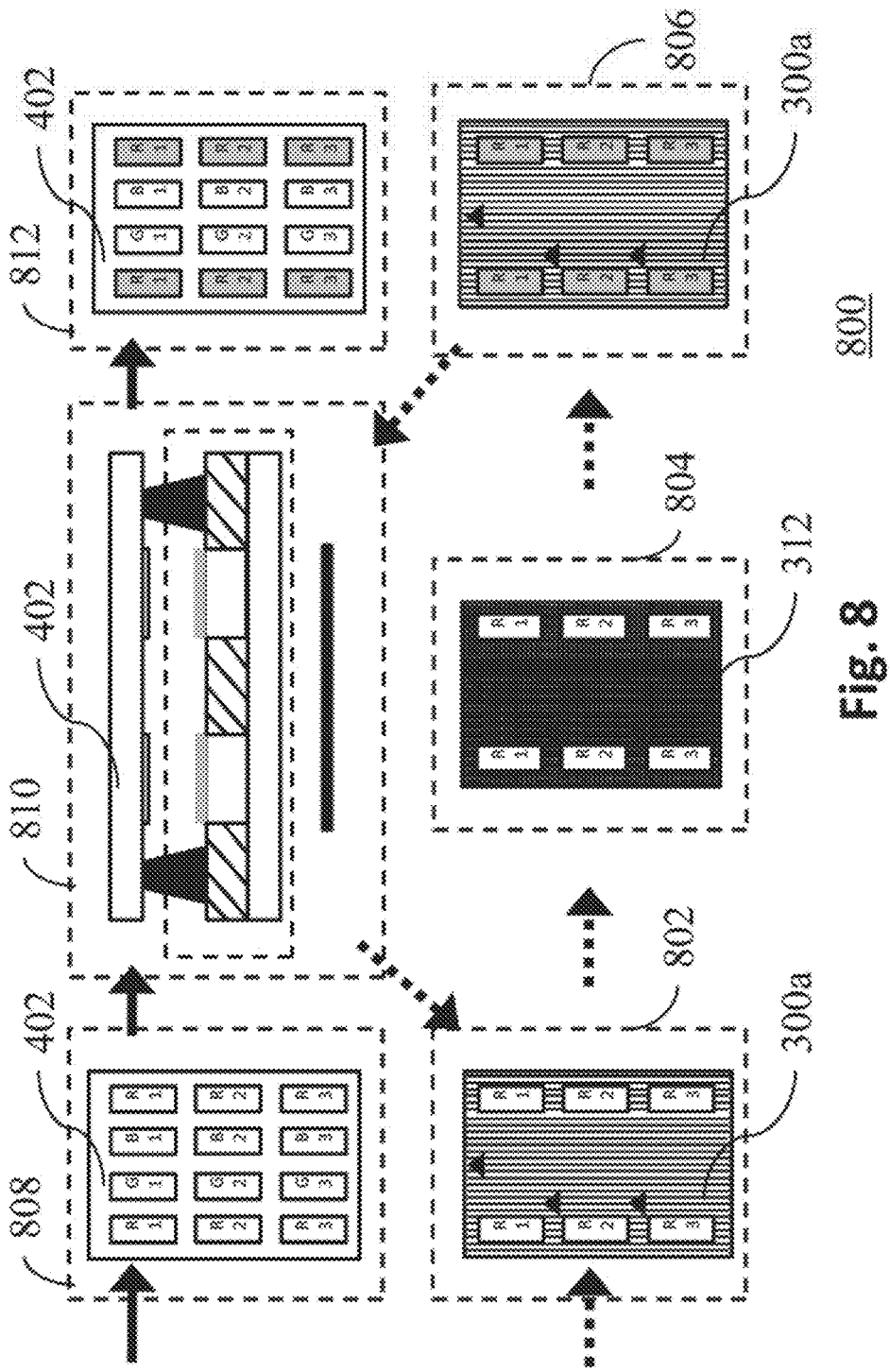
FIG. 8 illustrates a fabrication system, in accordance with an embodiment of the present invention.

FIG. 8 illustrates a fabrication system 800, in accordance with an embodiment of the present invention. The fabrication system 800 includes fabrication stations 802-812. At the fabrication station 802, the pre-defined patterned source substrate 300a is provided. At this fabrication station 802, the pre-defined patterned source substrate 300a does not have the one or more organic materials 312. In FIG. 8, with reference to fabrication station 802 and pre-defined patterned source substrate 300a, the clear island areas represent optically reflecting regions or source regions 310 and all the surrounding areas (denoted by the diagonal pattern fill) represent the optically absorbing regions 306. Further, the figure shows an example of an array of source regions that will incorporate emission layer materials for red pixels. Then the pre-defined patterned source substrate 300a moves to the fabrication station 804, where a layer of the one or more organic materials 312 is disposed over the entire area of the pre-defined patterned source substrate 300a (denoted by gray shaded areas). In this example, the one or more organic materials 312 uniformly deposited on the pre-defined patterned source substrate 300a represent the red emission layers. Then at the fabrication station 806, the one or more organic materials 312 are selectively removed from the plurality of optically absorbing regions 306. The one or more organic materials 312 is removed by application of optical illumination. The light is reflected from the plurality of optically reflecting regions 304, whereas light is converted into thermal energy at the plurality of optically absorbing regions 306. This raises the temperature of the one or more organic materials 312 at the plurality of optically absorbing regions 306, leading to selective removal of the organic materials. The temperature is raised above the sublimation temperature to ensure removal and this process will be performed at non-equilibrium conditions to minimize spreading of heat into the plurality of source regions 310. At this stage, the pre-defined patterned source substrate 300a having an organic material corresponding to a single color is manufactured. In this example, the pre-defined patterned source substrate 300a is shown to have red color organic material deposited at the plurality of optically reflecting regions 304. The pre-defined patterned source substrates 300a can be manufactured in a similar fashion for green and blue colors or any other functional organic layer used in the organic device 100.

Meanwhile, the patterned product substrate 402 is provided at the fabrication station 808. FIG. 8 shows the view of the patterned product substrate from the product substrate side. The product principal surface is therefore on the opposite side of the shown view. Then the patterned product substrate 402 and the pre-defined patterned source substrate 300a of a single color reach the fabrication station 810. At the fabrication station 810, the patterned product substrate 402 and the pre-defined patterned source substrate 300a are aligned using conventional techniques. A thermal source then heats the pre-defined patterned source substrate 300a, which causes sublimation of the one or more organic materials 312 (of a specific color). During the heating process, the temperature of the one or more organic materials 312 (of a specific color), the underlying optically reflecting regions 304, any other underlying layers and the underlying source base substrate 308 are maintained at a substantially same temperature. This allows for redeposition, while establishing and maintaining a thermal equilibrium during the sublimation process, of the one or more organic materials 312 (of a specific color) from the pre-defined patterned source substrate 300a onto the patterned product substrate 402. Both the functional layers and emissive layers can be redeposited in the fabrication station 810 using the process and apparatus described above at substantially similar conditions. The symmetric arrangement of the plurality of optically reflecting regions 304 and the plurality of optically absorbing regions 306 ensures a straightforward and simple way of sublimating and redepositing the one or more organic materials 312 simultaneously across the entire source substrate to achieve a high resolution pixel formation on the entire patterned product substrate 402.

Thereafter, a blank pre-defined patterned source substrate (the pre-defined patterned source substrate 300a without the one or more organic materials 312) is returned to the fabrication station 802 and the patterned product substrate 402 having organic material of a specific color is transferred to the fabrication station 812. To redeposit organic material of a second color on the patterned product substrate 402, already having the organic material of a first color, the above process is followed again with the one or more organic materials 312 of the second color and so forth. This provide a continuous and modular process of patterning.

The embodiments of disclosed invention provides for precision patterning to produce the Red Green Blue (RGB) pixels for an OLED display. The embodiments of disclosed invention also provides for formation of emitter and functional organic layers on OLED display using the same technique, thus, significantly reducing the complexity and cost of fabrication. The patterning technique in embodiments of the disclosed invention can also be used to manufacture high-resolution large area displays. The embodiments of patterning technique are versatile and applicable for fabrication of all resolutions, shapes and sizes. The embodiments of disclosed invention provide a high throughput and modular patterning technique. The embodiments of the disclosed invention are practiced at a relatively lower temperature (compared to that of laser) in an relatively stable thermal environment. This leads to lower cost of operation and longer life of components used. Further, a simpler process of high-resolution deposition is provided by some embodiments of the present invention. Moreover, the resolution to be achieved should be independent of beam size of an optical source or the heated area of a source base substrate.

It is apparent to a person ordinarily skilled in the art that the invention can be applied to all OLED devices which have sublimable organic materials, without changing the scope of the invention, in the same way it is applied to an organic device as described in the specification. It should be understood that this invention is, in many respects, only illustrative Changes may be made in details, particularly in matters of shape, size, and arrangement of steps without exceeding the scope of the invention. This may include, to the extent that it is appropriate, the use of any of the features of one example embodiment being used in other embodiments. The invention's scope is, of course, defined in the language in which the appended claims are expressed.

What is claimed:

1. A method of patterning an organic device comprising the steps of:
    (a) providing a patterned product substrate and a pre-defined patterned source substrate, wherein the patterned product substrate has a product principal surface, the product principal surface being defined by a plurality of destination regions, wherein the pre-defined patterned source substrate has a source principal surface, further wherein the pre-defined patterned source substrate has a plurality of optically reflecting regions and a plurality of optically absorbing regions, the plurality of optically reflecting regions and the plurality of optically absorbing regions are arranged such that each optically reflecting region is adjacent to at least one of the plurality of optically absorbing regions, the source principal surface being defined by a plurality of source regions, the plurality of source regions being defined at the plurality of optically reflecting regions, wherein the plurality of source regions has one or more organic materials disposed thereon;
    (b) aligning the product principal surface and the source principal surface such that each of the plurality of source regions is aligned to exactly one destination region of the plurality of destination regions, wherein the product principal surface is substantially parallel to the source principal surface, further wherein at least one of the product principal surface and the source principal surface has one or more supports to maintain a substantially uniform gap between the plurality of source regions and the plurality of destination regions;
    (c) raising a temperature of the pre-defined patterned source substrate above a sublimation temperature of the one or more organic materials, wherein the temperature is raised such that, at a location on the pre-defined patterned source substrate, the one or more organic materials, underlying optically reflecting regions of the plurality of optically reflecting regions and one or more underlying layers on the pre-defined patterned source substrate are maintained at a substantially equal temperature;
    (d) sublimating the one or more organic materials at the optically reflecting regions of the pre-defined patterned source substrate; and
    (e) redepositing the one or more organic materials at a substantially nearest destination region of the plurality of destination regions on the patterned product substrate.

2. The method of claim 1, further comprising the step of forming one or more emitter layers at a substantially nearest destination region of the plurality of destination regions on the patterned product substrate, wherein the one or more emitter layers correspond to one or more primary colors or a combination thereof when the organic device is one of a single stack or a multiple stack organic light emitting device.

3. The method of claim 1, wherein said step of redepositing the one or more organic materials at a substantially nearest destination region of the plurality of destination regions on the patterned product substrate comprises the step of forming at least one of one or more functional layers and one or more emitter layers at a substantially nearest destination region of the plurality of destination regions on the patterned product substrate.

4. The method of claim 1, wherein the pre-defined patterned source substrate has the one or more organic materials, the one or more organic materials corresponds to one or more primary colors or a combination thereof when the organic device is one of a single stack or multiple stack organic light emitting device.

5. The method of claim 1, wherein the one or more organic materials is a multicomponent mixture, further wherein each component of the multicomponent mixture has substantially similar sublimation characteristics.

6. The method of claim 1, wherein the temperature of the pre-defined patterned source substrate is raised in parts or as a whole.

7. The method of claim 1, further comprising the steps of:
    providing a source base substrate, wherein the source base substrate is substantially optically transparent;
    providing the plurality of optically reflecting regions and the plurality of optically absorbing regions on the source base substrate, wherein the plurality of optically reflecting regions and the plurality of optically absorbing regions are arranged such that two optically reflecting regions are separated by at least one optically absorbing region;
    disposing the one or more organic materials on the plurality of optically reflecting regions and the plurality of optically absorbing regions;
    applying optical illumination through the source base substrate to selectively raise the temperature of the one or more organic materials disposed at the plurality of optically absorbing regions above the sublimation temperature; and
    selectively removing the one or more organic materials disposed on the plurality of optically absorbing regions.

8. The method of claim 1, wherein each region of the plurality of destination regions and each region of the plurality of source regions are of substantially same area, further wherein the area is at least 900 square microns.

9. The method of claim 1, wherein each of the plurality of optically absorbing regions is separated from a nearest optically absorbing region by at least 30 microns.

10. The method of claim 1, wherein the substantially uniform gap between the plurality of source regions and the plurality of destination regions is between 6 to 20 microns.

11. The method of claim 1, wherein the one or more supports are located on the patterned product substrate at the product principal surface except at the plurality of destination regions.

12. The method of claim 1, wherein the one or more supports are located on the pre-defined patterned source substrate at the source principal surface except at the plurality of source regions.

13. The method of claim 1, wherein the one or more supports are one or more of the plurality of optically absorbing regions of the pre-defined patterned source substrate, further wherein the one or more supports are substantially optically transparent.

14. The method of claim 1, wherein the plurality of optically reflecting regions and the plurality of optically absorbing regions have substantially high thermal conductivities.

15. A pre-defined patterned source substrate for use in fabrication of an organic device, the pre-defined patterned source substrate comprising:

a source base substrate, wherein the source base substrate is substantially optically transparent; and an optical modifier layer over the source base substrate, the optical modifier layer comprising:

a plurality of optically reflecting regions, wherein the plurality of optically reflecting regions define a plurality of source regions, the plurality of source regions being configured to house one or more organic materials; and a plurality of optically absorbing regions, wherein the plurality of optically absorbing regions are arranged such that each optically absorbing region of the plurality of optically absorbing regions is adjacent to at least one optically reflecting region of the plurality of optically reflecting regions.

16. The pre-defined patterned source substrate of claim 15, wherein each region of the plurality of source regions is at least 900 square microns.

17. The pre-defined patterned source substrate of claim 15, wherein each of the plurality of optically absorbing regions is separated from a nearest optically absorbing region by at least 30 microns.

18. The pre-defined patterned source substrate of claim 15, wherein the source base substrate, the plurality of optically reflecting regions and the plurality of optically absorbing regions have thermal conductivities of 1 to 1.2, 20 to 400 and 60 to 200 $W·m^{-1}·K^{-1}$ respectively.

19. The pre-defined patterned source substrate of claim 15, wherein the one or more organic materials at the plurality of source regions are redeposited at a substantially nearest destination region of a plurality of destination regions on a patterned product substrate associated with the organic device, further wherein redeposition of the one or more organic materials takes place due to sublimation.

20. The pre-defined patterned source substrate of claim 15, wherein the one or more organic materials corresponds to one or more primary colors or a combination thereof when the organic device is one of a single stack or multiple stack organic light emitting device.

21. The pre-defined patterned source substrate of claim 15, wherein the pre-defined patterned source substrate is manufactured by a method comprising the steps of:

(a) providing the source base substrate, wherein the source base substrate is substantially optically transparent;

(b) providing the plurality of optically reflecting regions and the plurality of optically absorbing regions on the source base substrate, the plurality of optically reflecting regions and the plurality of optically absorbing regions are arranged such that an optically absorbing region separates two optically reflecting regions;

(c) disposing the one or more organic materials on the plurality of optically reflecting regions and the plurality of optically absorbing regions;

(d) applying optical illumination through the source base substrate to selectively raise a temperature of the one or more organic materials disposed at the plurality of optically absorbing regions above a sublimation temperature; and (e) selectively removing the one or more organic materials disposed on the plurality of optically absorbing regions.

22. The pre-defined patterned source substrate of claim 15 further comprising one or more supports, wherein the one or more supports are located on the pre-defined patterned source substrate except at the plurality of optically reflecting regions.

23. The pre-defined patterned source substrate as recited of claim 15 further comprising one or more supports, wherein the one or more supports are one or more of the plurality of optically absorbing regions of the pre-defined patterned source substrate, further wherein the one or more supports are substantially optically transparent.

* * * * *